United States Patent
Ohtsuka

(10) Patent No.: US 10,411,667 B2
(45) Date of Patent: Sep. 10, 2019

(54) SOUND SIGNAL PROCESSING APPARATUS AND IMAGING DEVICE USING SAME

(71) Applicant: Panasonic Intellectual Property Management Co., Ltd., Osaka (JP)

(72) Inventor: Yoshio Ohtsuka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/899,522

(22) Filed: Feb. 20, 2018

(65) Prior Publication Data

US 2018/0175815 A1 Jun. 21, 2018

Related U.S. Application Data

(63) Continuation of application No. PCT/JP2016/003662, filed on Aug. 9, 2016.

(30) Foreign Application Priority Data

Sep. 14, 2015 (JP) .................................. 2015-181091

(51) Int. Cl.
*H03G 3/00* (2006.01)
*H03G 11/04* (2006.01)
(Continued)

(52) U.S. Cl.
CPC .............. *H03G 3/001* (2013.01); *H03G 3/04* (2013.01); *H03G 3/3005* (2013.01);
(Continued)

(58) Field of Classification Search
CPC ...... H03G 3/001; H03G 11/04; H03G 3/3005; H03G 3/04; H03G 9/005; H04N 9/802;
(Continued)

(56) References Cited

U.S. PATENT DOCUMENTS

| 2005/0117757 A1* | 6/2005 | Okimoto | ............... | H03G 9/005 381/102 |
| 2005/0280470 A1* | 12/2005 | Ogura | ................... | H03G 3/301 330/281 |

(Continued)

FOREIGN PATENT DOCUMENTS

JP 2014-126854 A 7/2014

OTHER PUBLICATIONS

International Search Report for corresponding PCT/JP2016/003662, dated Oct. 25, 2016.

*Primary Examiner* — Timothy J Henn
(74) *Attorney, Agent, or Firm* — Renner, Otto, Boisselle & Sklar, LLP

(57) ABSTRACT

A sound signal processing apparatus includes: first amplifier which amplifies a sound signal, depending on an input level of the sound signal; and second amplifier which amplifies with a gain the sound signal amplified by first amplifier. Second amplifier automatically decreases the gain when a level of the sound signal is greater than an upper limit threshold, and second amplifier automatically increases the gain when the level of the sound signal is lower than the upper limit threshold and when the gain is lower than a predetermined value. When second amplifier increases the gain, second amplifier changes the gain at a first speed when a user has performed an operation to decrease the input level, and second amplifier changes the gain at a second speed lower than the first speed when the user has not performed the operation to decrease the input level.

6 Claims, 5 Drawing Sheets

(51) Int. Cl.
  *H04R 3/00*   (2006.01)
  *H03G 9/00*   (2006.01)
  *H04N 5/232*  (2006.01)
  *H04N 5/77*   (2006.01)
  *H04N 9/802*  (2006.01)
  *H03G 3/04*   (2006.01)
  *H03G 3/30*   (2006.01)

(52) U.S. Cl.
  CPC ............. *H03G 9/005* (2013.01); *H03G 11/04* (2013.01); *H04N 5/23229* (2013.01); *H04N 5/772* (2013.01); *H04N 9/802* (2013.01); *H04R 3/00* (2013.01); *H04R 2410/00* (2013.01); *H04R 2499/11* (2013.01)

(58) Field of Classification Search
  CPC ...... H04N 5/772; H04N 5/23229; H04R 3/00; H04R 2410/00; H04R 2499/11
  See application file for complete search history.

(56) References Cited

U.S. PATENT DOCUMENTS

| | | | |
|---|---|---|---|
| 2006/0017501 A1* | 1/2006 | Nodake | H03G 3/301 330/141 |
| 2006/0097784 A1* | 5/2006 | Lind | H03F 1/32 330/251 |
| 2010/0195846 A1* | 8/2010 | Yokoyama | H03G 7/002 381/102 |
| 2011/0150237 A1* | 6/2011 | Nagasue | H03F 3/187 381/94.1 |
| 2011/0200209 A1* | 8/2011 | Yamada | H03G 9/025 381/102 |
| 2014/0185833 A1* | 7/2014 | Ikeda | H03G 3/301 381/107 |

* cited by examiner

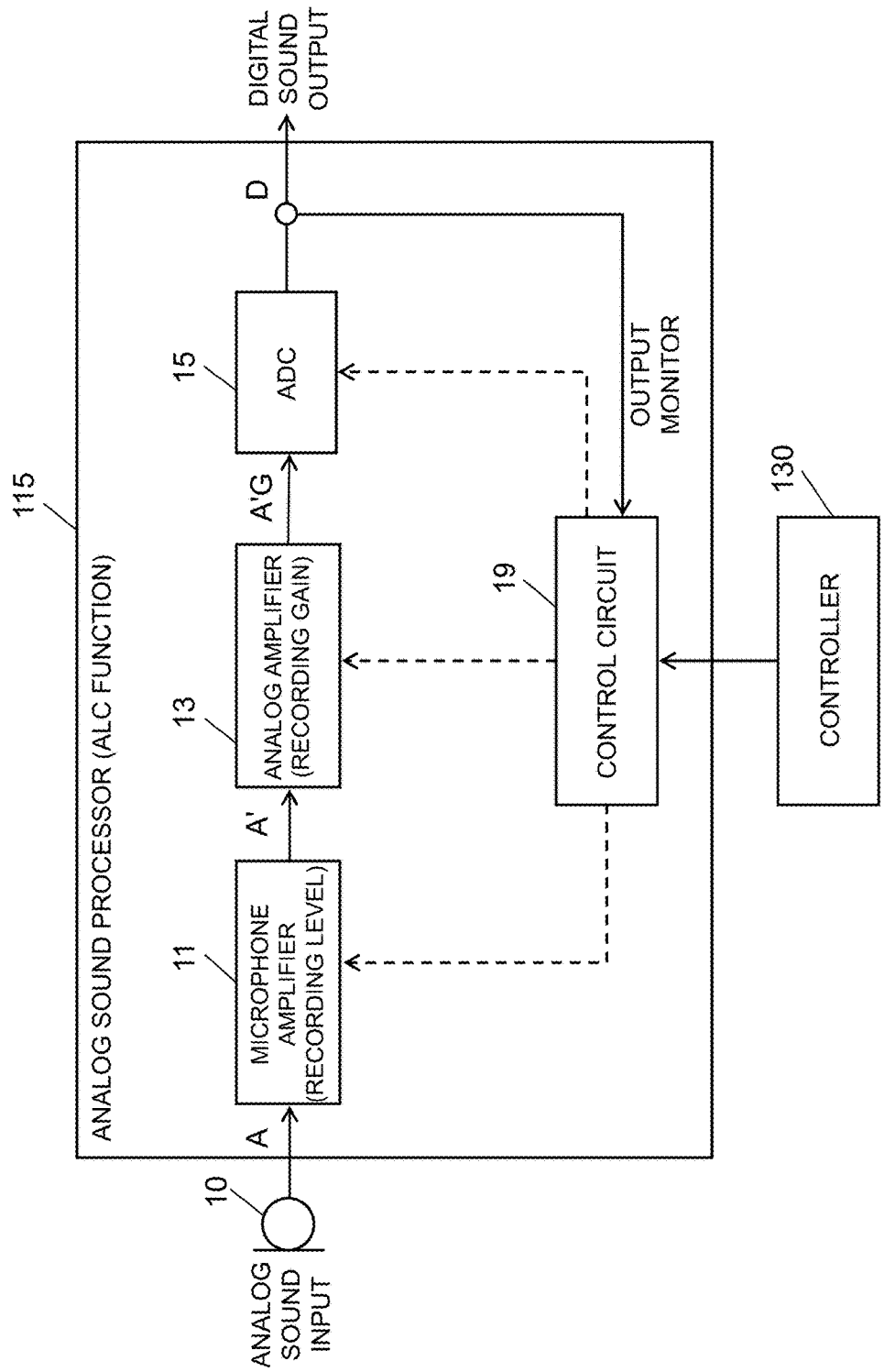

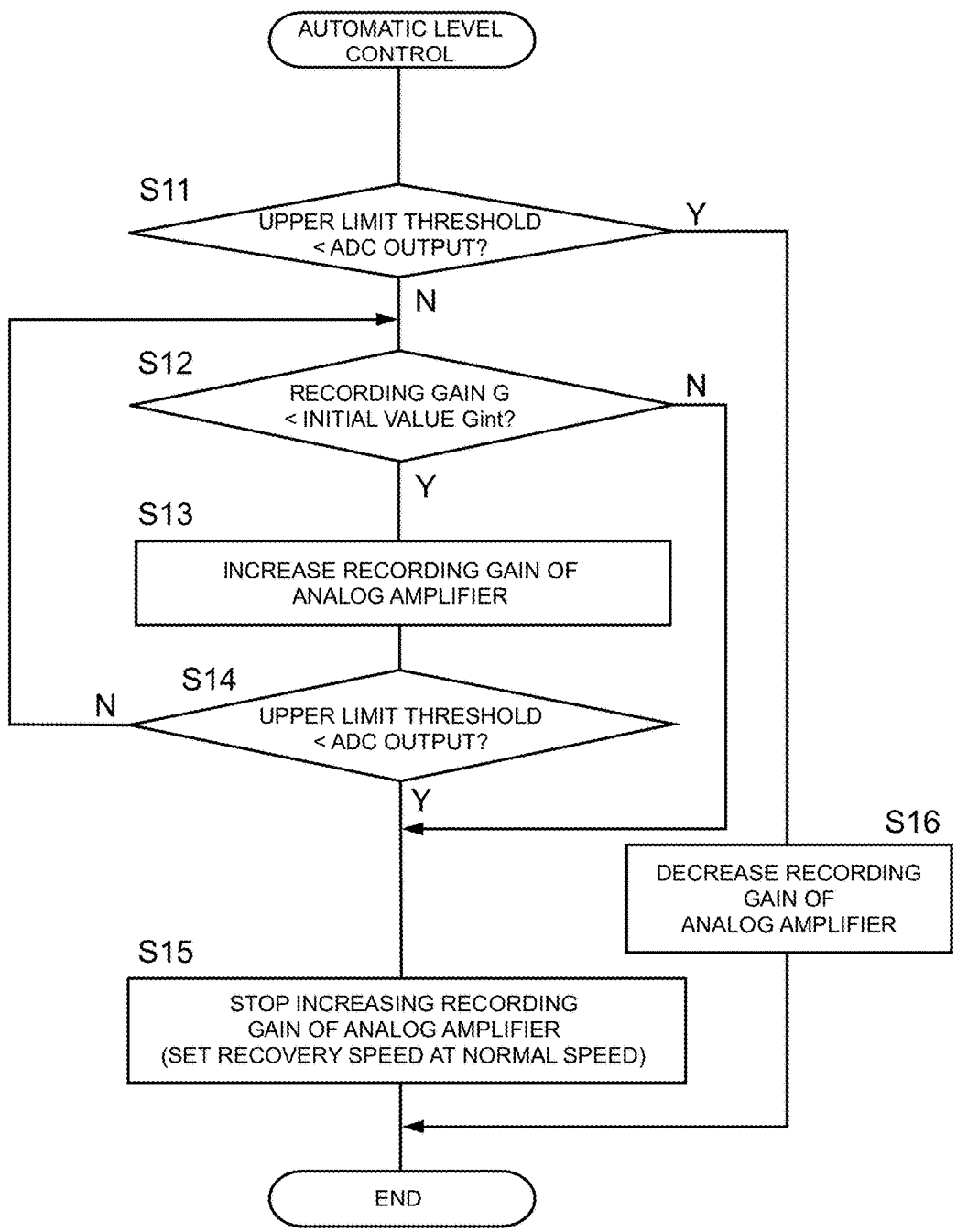

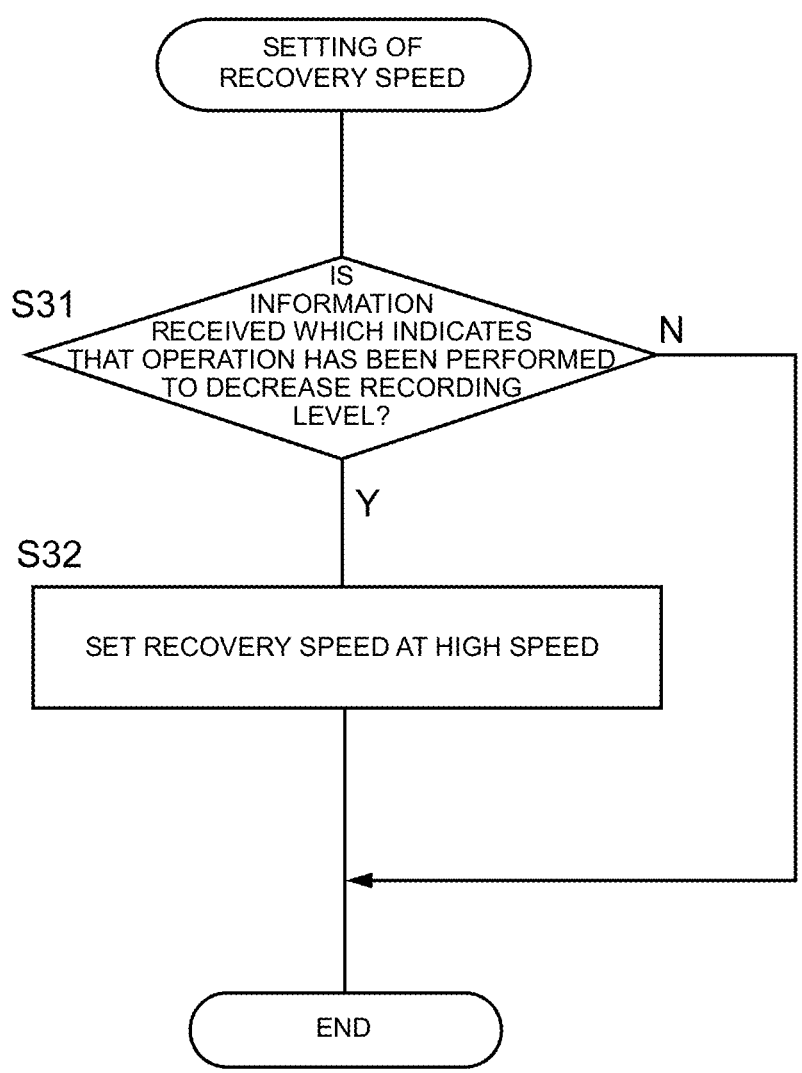

SOUND SIGNAL PROCESSING APPARATUS AND IMAGING DEVICE USING SAME

BACKGROUND

1. Technical Field

The present disclosure relates to a sound signal processing apparatus in which a sound signal level is automatically controlled, and relates to an imaging device using the same.

2. Description of the Related Art

Conventionally, there is known a sound processing apparatus having an automatic level control (ALC) function for controlling an input sound at an appropriate level (see Unexamined Japanese Patent Publication No. 2014-126854, for example).

A sound processing apparatus of Unexamined Japanese Patent Publication No. 2014-126854 adjusts an amplitude level of a sound signal having been input such that the amplitude level stays within a predetermined range. The sound processing apparatus has a first level controller and a second level controller. The first level controller performs, when the amplitude level of the sound signal having been input has exceeded an upper limit value of a predetermined range, a limit operation in which a gain of an amplitude level is decreased, and performs, when the amplitude level of the sound signal is smaller than a lower limit value of the predetermined range, a recovery operation in which the gain is increased. The second level controller performs again the limit operation or the recovery operation on the sound signal whose amplitude level has been adjusted by the first level controller. A time constant of the increase in the gain at the time of the recovery operation by the first level controller is set greater than the time constant of the increase in the gain at the time of the recovery operation by the second level controller. With this configuration, it is possible to achieve excellent automatic level control by which no distortion is generated even when attack sounds are input sequentially with a short cycle.

SUMMARY

The present disclosure provides a sound signal processing apparatus in which a response in a change in an input level is improved when a user performs an operation to change the input level of a sound signal while an automatic level control function is being performed.

A sound signal processing apparatus of the present disclosure includes: a first amplifier which amplifies a sound signal having been input, depending on an input level of the sound signal; and a second amplifier which amplifies with a gain the sound signal amplified by the first amplifier. The second amplifier automatically decreases the gain when a level of the sound signal amplified by the first amplifier is greater than an upper limit threshold, and increases the gain when the level of the sound signal amplified by the first amplifier is lower than the upper limit threshold and when the gain is lower than a predetermined value. When the gain is increased, the second amplifier changes the gain at a first speed when a user has performed an operation to decrease the input level; and the second amplifier changes the gain at a second speed lower than the first speed when the user has not performed the operation to decrease the input level.

BRIEF DESCRIPTION OF THE DRAWINGS

FIG. 2 is a diagram showing a configuration related to automatic level control (ALC) in an analog sound processor;

FIG. 3 is a flowchart showing the automatic level control;

FIG. 5 is a flowchart showing a setting process of a recovery speed.

DETAILED DESCRIPTION

Hereinafter, exemplary embodiments will be described in detail with reference to the drawings as appropriate. However, an unnecessarily detailed description will not be given in some cases. For example, a detailed description of a well-known matter and a duplicated description of substantially the same configuration will be omitted in some cases. This is to avoid the following description from being unnecessarily redundant and thus to help those skilled in the art to easily understand the description.

Note that the inventor provides the attaching drawings and the following description to help those skilled in the art to sufficiently understand the present disclosure, and the inventor does not intend to use the drawings or the description to limit the subject matters of the claims.

First Exemplary Embodiment

Hereinafter, a first exemplary embodiment will be described with reference to the drawings.
[1-1. Configuration]
[1-1-1. General Configuration]

Figure 1:
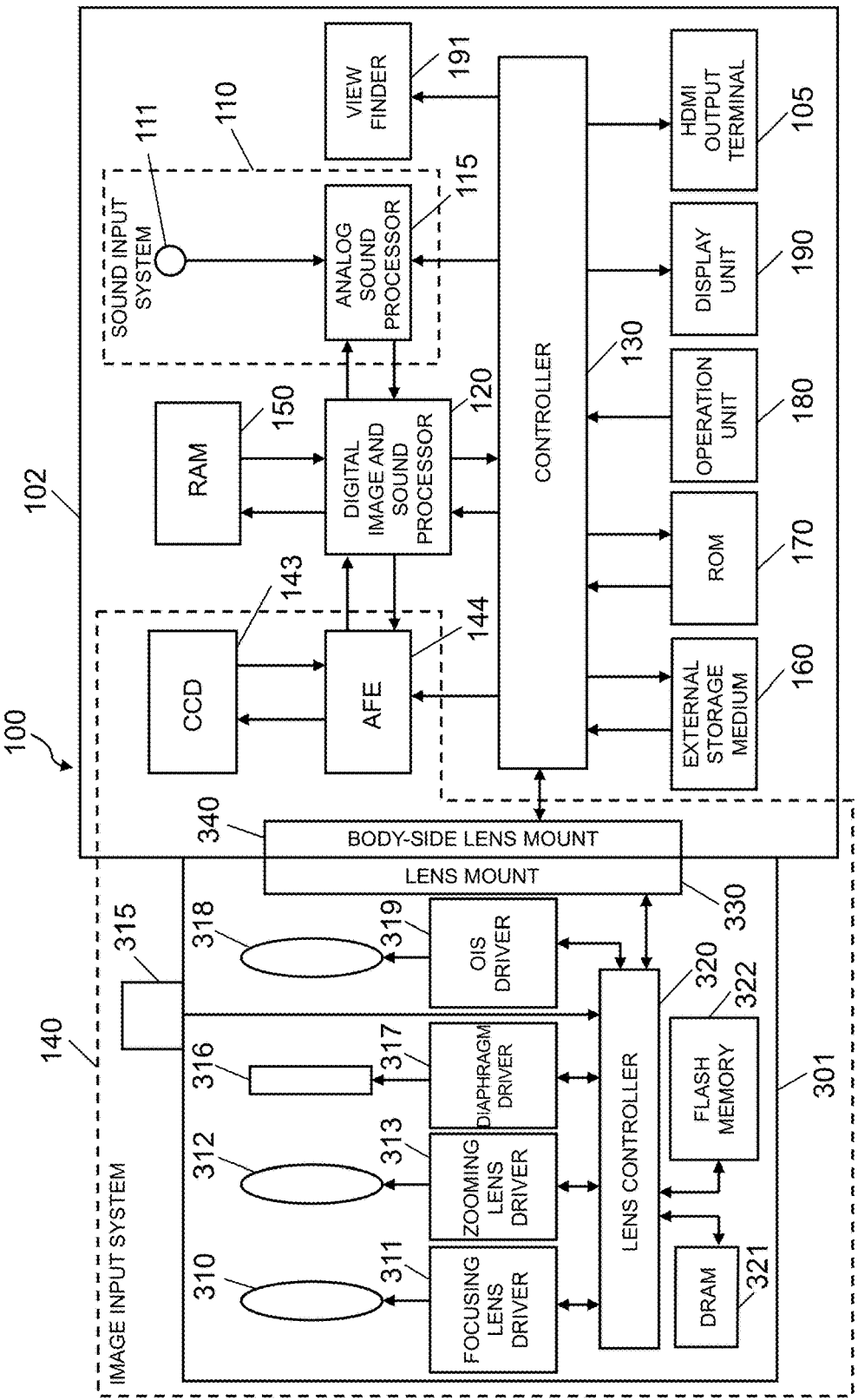
FIG. 1 is a diagram showing a configuration of an imaging device equipped with a sound signal processing apparatus of the present disclosure.

FIG. 1 is a diagram showing a configuration of a digital camera (an example of an imaging device) equipped with an analog sound processor (an example of a sound signal processing apparatus) of the first exemplary embodiment. The digital camera takes an image of a subject to generate image data (a still image, a moving image) and stores the image data in a recording medium. Digital camera 100 is configured with camera body 102, and interchangeable lens 301 attached to camera body 102. Digital camera 100 has: image input system 140 which inputs an image; and sound input system 110 which inputs an analog sound. Digital camera 100 can store in the recording medium a sound signal having been input via sound input system 110, together with an image having been input via image input system 140.

Image input system 140 includes interchangeable lens 301, charge-coupled-device (CCD) image sensor 143, and analog front end (AFE) 144. CCD image sensor 143 and AFE 144 are provided on a side of camera body 102.

Interchangeable lens 301 includes an optical system including focusing lens 310, optical image stabilizer (OIS) lens 318, and zooming lens 312. Interchangeable lens 301 further equipped with lens controller 320, lens mount 330, focusing lens driver 311, zooming lens driver 313, diaphragm 316, diaphragm driver 317, operation ring 315, optical image stabilizer (OIS) controller 319, dynamic random access memory (DRAM) 321, flash memory 322, and the like.

Lens controller 320 controls entire operation of interchangeable lens 301. Lens controller 320 accepts an operation of operation ring 315 performed by a user, and can control zooming lens driver 313 such that zooming lens 312 is driven. Lens controller 320 can control focusing lens driver 311, OIS controller 319, and diaphragm driver 317 such that focusing lens 310, OIS lens 318, and diaphragm 316 are driven.

Lens controller 320 is connected to DRAM 321 and flash memory 322, and writes or reads information in or from these memories as necessary. Further, lens controller 320 can communicate with controller 130 via lens mount 330. Controller 130 may be configured with a hard-wired electronic circuit or may be configured with a microcomputer using a program or the like.

Lens mount 330 is connected to body-side lens mount 340 of camera body 102 so as to mechanically and electrically connect interchangeable lens 301 and camera body 102 to each other. When interchangeable lens 301 is connected with camera body 102, lens controller 320 and controller 130 can communicate with each other. Body-side lens mount 340 can transmit a signal received from lens controller 320 via lens mount 330 to controller 130 of camera body 102.

CCD image sensor 143 picks up a subject image formed through interchangeable lens 301 to generate image information.

AFE 144 performs on the image information read out from CCD image sensor 143 noise suppression by correlated double sampling, amplification to a width of an input range of an A/D converter (ADC: Analog-to-Digital Converter) by an analog gain controller, and A/D conversion (analog-to-digital conversion) by the A/D converter.

Sound input system 110 is equipped with microphone unit 111 and analog sound processor 115. Microphone unit 111 is equipped with two microphones to separately collect a sound from each of the right and left directions. The microphones convert sound signals to electric signals (analog sound signals). The analog sound signals from the microphones are input to analog sound processor 115.

Analog sound processor 115 performs predetermined signal processing on the analog sound signal. Analog sound processor 115 converts the processed analog sound signal to a digital sound signal with the A/D converter and outputs the digital sound signal to digital image and sound processor 120. Analog sound processor 115 is an example of the sound signal processing apparatus. Analog sound processor 115 is configured with an electronic circuit including an analog circuit, namely, one or a plurality of semiconductor integrated circuits.

Digital image and sound processor 120 executes various processes on image information output from AFE 144 and on a sound signal output from analog sound processor 115. For example, digital image and sound processor 120 performs gamma correction, white balance correction, defect correction, an encoding process, and the like on the image information, following an instruction from controller 130. Further, digital image and sound processor 120 executes various processes on the sound signals, following an instruction from controller 130. Digital image and sound processor 120 may be realized by a hard-wired electronic circuit or may be realized by a microcomputer which executes a program or the like. Digital image and sound processor 120 may be realized as one semiconductor chip integrated with controller 130 or the like.

Digital image and sound processor 120 performs a filtering process and a directivity synthesis process by performing arithmetic processing on a sound signal which is an output from microphone unit 111. A circuit which realizes digital image and sound processor 120 may be integrated into one or a plurality of semiconductor integrated circuits.

Display unit 190 is disposed on a rear surface of digital camera 100. In the present exemplary embodiment, display unit 190 is a liquid crystal display. Display unit 190 displays an image based on the image information processed by digital image and sound processor 120.

Controller 130 integrally controls entire operation of digital camera 100. Controller 130 may be realized by a hard-wired electronic circuit or may be realized by a microcomputer which performs a program or the like. Alternatively, controller 130 may be realized as one semiconductor chip integrated with digital image and sound processor 120 or the like. Further, read-only memory (ROM) 170 does not have to be outside of controller 130 (as a member separate from controller 130) and may be incorporated in controller 130.

ROM 170 stores a program for integrally controlling the entire operation of digital camera 100 in addition to programs, to be executed by controller 130, related to automatic focus control (AF control), automatic exposure control (AE control), light emission control of an electronic flash, and the like. ROM 170 stores various conditions and settings related to digital camera 100. Note that in the present exemplary embodiment, ROM 170 is a flash ROM.

Random-access memory (RAM) 150 functions as a working memory of digital image and sound processor 120 and controller 130. RAM 150 can be realized by a synchronous dynamic random access memory (SDRAM), a flash memory, or the like. RAM 150 functions also as an internal memory in which image information, a sound signal, and the like are recorded.

External storage medium 160 is an external memory equipped therein with a nonvolatile storage such as a flash memory. External storage medium 160 can record data such as image information, a sound signal, and the like which are processed by digital image and sound processor 120.

Operation unit 180 is a general term of an operation interface such as an operation button and an operation dial disposed on an exterior of digital camera 100. Operation unit 180 accepts an operation performed by a user. For example, operation unit 180 includes a release button, a power switch, and a mode dial provided on an upper surface of digital camera 100, and includes a center button, a cross button, and the like provided on the rear surface of digital camera 100. When operation unit 180 accepts an operation performed by a user, operation unit 180 informs controller 130 of an instruction signal for instructing various operations.

The release button is an operation member for a user to give instructions of picking up an image and automatic focusing. When the release button is half-pressed by a user, controller 130 determines a shooting condition by performing at least one of auto focus (AF) control, auto exposure (AE) control, and the like. Subsequently, when the release button is full-pressed, controller 130 records image information picked up at a time of the full-pressing of the release button, in external storage medium 160 or the like.

The power switch is a switch to turn on and off power supplied to respective parts of digital camera 100.

The mode dial is a rotary dial. When the mode dial is turned by a user, controller 130 switches an operation mode of digital camera 100 to the operation mode corresponding to a current position of the mode dial. The operation mode includes, for example, an automatic shooting mode, a manual shooting mode, a scene selection mode, and the like.

Further, operation unit 180 may include, in addition to the above operation members, a button to make display unit 190 display a menu screen and a button to select values for setting items of various conditions displayed on the menu screen. Further, operation unit 180 may include a touch panel which is disposed to overlap display unit 190 so as to detect a touch operation by a finger of a user.

[1-1-2. Analog Sound Processor]

Analog sound processor 115 has an automatic level control (ALC) function. The automatic level control function is for automatically adjusting a gain such that a level of a digital sound signal to be output does not exceed a predetermined upper limit threshold regardless of a level of an analog sound signal having been input. There are various known methods for automatic level control. FIG. 2 is a diagram showing a major configuration for realizing functions of the automatic level control (ALC) in analog sound processor 115.

Analog sound processor 115 is equipped with microphone amplifier 11, analog amplifier 13, A/D converter (ADC: Analog-to-Digital Converter) 15, and control circuit 19. Note that for convenience of description, FIG. 2 shows the configuration related to automatic level control of a sound signal from one of the two existing microphones each on the right and left.

Microphone amplifier 11 is a circuit which adjusts a recording level (input level) of a sound signal being input from microphone 10. Microphone amplifier 11 includes an amplifier circuit for a sound signal. The recording level is set by a user via operation unit 180 (user interface). A set value of the recording level (input level) by the user is communicated from controller 130 to control circuit 19. Control circuit 19 sets the recording level of microphone amplifier 11 according to the communicated set value of the recording level.

Analog amplifier 13 amplifies the sound signal from microphone amplifier 11, depending on the recording gain. Analog amplifier 13 includes an amplifier circuit for the sound signal. The recording gain is changed depending on the signal level of the analog sound signal being input. Specifically, when the signal level of the analog sound signal being input has exceeded an upper limit threshold, analog amplifier 13 decreases the recording gain; and after that, when the signal level of the analog sound signal being input becomes low, analog amplifier 13 gradually increases the recording gain so as to set the recording gain back to the original initial value (Gint). The process in which the recording gain is being set back to the original initial value is referred to as "recovery".

Control circuit 19 is a circuit which controls operation of analog sound processor 115. For example, control circuit 19 controls the recording level of microphone amplifier 11, a recovery speed and a recording gain G of analog amplifier 13.

In analog sound processor 115 having the above-mentioned configuration, the sound collected by microphone 10 is converted to a sound signal A and is input to microphone amplifier 11. Microphone amplifier 11 adjusts the recording level (input level) of the sound signal from microphone 10 according to the setting of the user. Analog amplifier 13 amplifies a sound signal A' from microphone amplifier 11 with the recording gain G and outputs the amplified signal to A/D converter 15. When a level of the sound signal A'G being input to A/D converter 15 has exceeded a predetermined upper limit value, a clipped sound output (that is, a distorted sound) is output from A/D converter 15. To address this issue, if the level of the sound signal A' is very high and is possibly clipped by A/D converter 15, recording analog amplifier 13 decreases the recording gain G so as to decrease the level of the sound signal A'G to be input to A/D converter 15. After that, if the level of the sound signal A being input becomes low, analog amplifier 13 performs a recovery operation in which the recording gain G is gradually increased back to the predetermined initial value Gint. A/D converter 15 converts the sound signal A'G having been input from analog amplifier 13 to a digital signal D and outputs the converted digital signal D. Control circuit 19 is monitoring the sound output D of A/D converter 15.

[1-2. Operation]

[1-2-1. Automatic Level Control (ALC)]

Digital camera 100 of the present exemplary embodiment has a function of automatic level control (ALC) in which the recording gain is automatically controlled such that a recorded sound signal is not distorted even if the level of the sound signal being input is high. This automatic level control is realized by analog sound processor 115.

FIG. 3 shows a flowchart illustrating the automatic level control by analog sound processor 115. With reference to the flowchart of FIG. 3, the automatic level control will be described.

Control circuit 19 compares the sound output D of A/D converter 15 with the upper limit threshold (step S11). In this step, the upper limit threshold is previously set to a value lower than a value of the sound output D which is output when the sound output of A/D converter 15 is clipped. This will be described later, but by setting the upper limit threshold as described above, control circuit 19 decreases the recording gain of analog amplifier 13 so as to decrease the level of the analog sound signal A'G being input to A/D converter 15 before the sound output D of A/D converter 15 is actually clipped, thereby preventing a clipped sound output from being output from A/D converter 15.

If the level of the sound output D is higher than the upper limit threshold (step S11: YES), control circuit 19 decreases the recording gain G of analog amplifier 13 (step S16). Specifically, the recording gain G is set such that the sound output D does not exceed the upper limit threshold. For example, a new recording gain G may be calculated by a formula G=A'−(D−Dth), where Dth is the upper limit threshold. By this operation, the level of the analog sound signal A'G to be input to A/D converter 15 is decreased; thus, it is possible to prevent a sound output clipped by A/D converter 15 from being output.

On the other hand, if the level of the sound output D is not higher than the upper limit threshold (step S11: NO), control circuit 19 compares the value of the recording gain G of analog amplifier 13 with the previously set value (initial value Gint) (step S12). If the value of the recording gain G is lower than the initial value Gint (step S12: YES), control circuit 19 increases the recording gain G of analog amplifier 13 (step S13) (recovery operation).

In this operation, control circuit 19 increases the recording gain G of analog amplifier 13 at a set recovery speed. Setting of the recovery speed will be described later in detail.

After increasing the recording gain G in step S13, control circuit 19 compares the sound output D of A/D converter 15 with the upper limit threshold again (step S14). If the sound output D of A/D converter 15 does not exceed the upper limit threshold (step S14: NO), control circuit 19 compares the value of the recording gain G of analog amplifier 13 with the previously set initial value Gint again (step S12).

If the sound output D of A/D converter 15 has exceeded the upper limit threshold (step S14: YES), control circuit 19 stops increasing the recording gain G of analog amplifier 13 (step S15) and ends the process.

If NO in step S12, that is, in the case that the value of the recording gain G is not less than the initial value Gint, control circuit 19 stops increasing the recording gain G of analog amplifier 13 (step S15) and ends the process.

As described above, by changing the recording gain G, depending on the level of the sound output D, analog sound processor 115 of the present exemplary embodiment achieves automatic level control (ALC) in which the recording gain is automatically controlled such that the sound signal to be recorded is not distorted even when the level of the sound signal A' being output from microphone amplifier 11 is high.

[1-2-2. Recovery Speed]

As described above, the output D of A/D converter 15 is monitored, and when the sound signal A or A' becomes excessively high, the recording gain G of analog amplifier 13 is decreased. After that, when a level of the sound signal A or A' being input becomes low, the recovery operation is performed so as to set the recording gain G back to an initial value. In this recovery operation, the recovery speed is a speed at which the recording gain G is increased, and the recovery speed is set by control circuit 19. Hereinafter, the setting of the recovery speed will be described with reference to FIG. 4A and FIG. 4B. The horizontal axes of FIG. 4A and FIG. 4B each represent time, and the vertical axes each represent a level (amplitude). The gray areas in FIG. 4A and FIG. 4B each represent the level (amplitude) of the output A'G of analog amplifier 13.

Figure 4A:
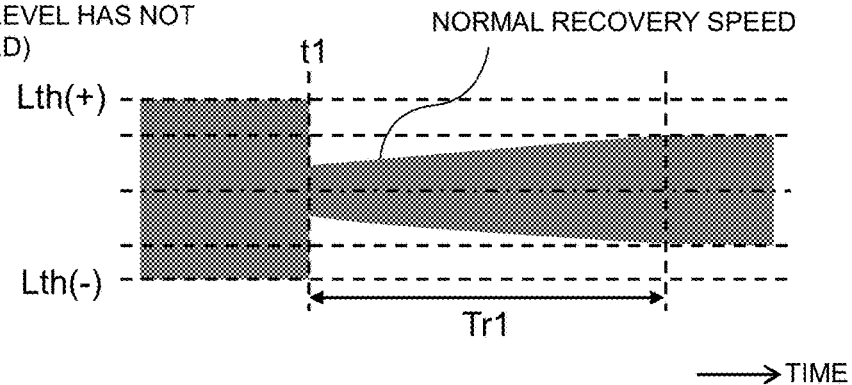
FIG. 4A is a view for describing a recovery speed in the automatic level control.
Figure 4B:
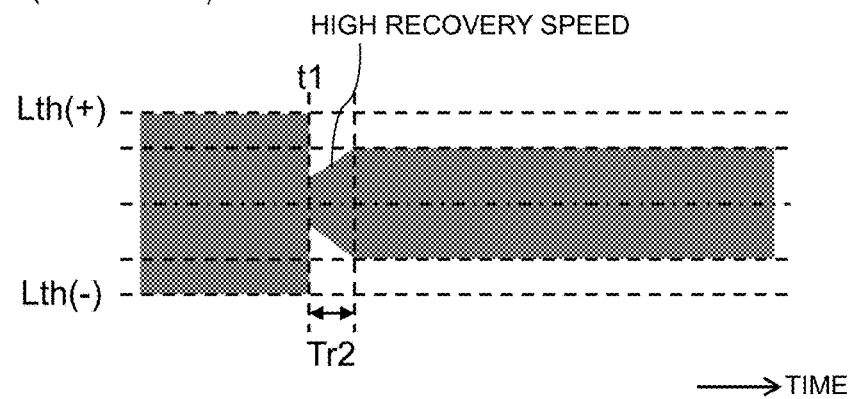
FIG. 4B is a view for describing the recovery speed in the automatic level control.

FIG. 4A is a view illustrating normal recovery operation after the recording gain G is decreased by the automatic level control. FIG. 4B is a view illustrating the recovery operation after the recording gain G is decreased by the automatic level control and in the case that a user has performed an operation to decrease the recording level of microphone amplifier 11 immediately before the recovery operation.

As shown in FIG. 4A, when a large sound is input to analog amplifier 13, the recording gain G is decreased by the automatic level control such that the level (amplitude) of the sound signal being input to A/D converter 15 stays within a predetermined range (Lth(+) to Lth(−)). Here, the predetermined range (Lth(+) to Lth(−)) is a range which ensures that the output D of A/D converter 15 stays within the upper limit threshold.

A description will be given with reference to FIG. 4A. FIG. 4A is a view showing temporal changes of the level (amplitude) of the output A'G of analog amplifier 13, where the level of the sound signal A is high at or before time t1, and becomes low after time t1. At or before time t1, the recording gain G is decreased, and the level A'G of the sound output is thus decreased and is within the predetermined range (Lth(+) to Lth(−)). After time t1, because the level of the sound signal A becomes low, the recovery operation is performed so as to set the recording gain G back to the initial value. In that process, the value of the recording gain is not rapidly increased, and instead, the recording gain is returned to the initial value in a relatively long time Tr1 (for example, 10 seconds). This is because if the recording gain G is rapidly increased, a rapid increase of a noise floor or the like makes an acoustically unnatural sound. To address this issue, analog amplifier 13 increases the recording gain at a relatively slow recovery speed in the normal recovery operation. After a relatively long time Tr1, the recording gain G becomes stable at a final value.

By the way, if a user intentionally performs, during recording of a sound, an operation to decrease the recording level of microphone amplifier 11, it is necessary to increase the recording gain G of analog amplifier 13 in order to make the recording gain G stable at the final value rapidly. In this case, because the user intentionally changes the recording level, the acoustic unnaturalness due to a rapid increase of the recording gain is not a problem, and a quick response is required. However, if the recovery speed is slow as mentioned above, the response to the change of the recording gain G is slow, and there arises a problem that the steady level after the change cannot be recognized immediately.

To address this issue, analog sound processor 115 of the present exemplary embodiment is configured such that if a user performs an operation to decrease the recording level, analog sound processor 115 increases, in the recovery operation, the recording gain G at a recovery speed (first speed) higher than a normal recovery speed. That is, as shown in FIG. 4B, if the user performs the operation to decrease the recording level of microphone amplifier 11, the recovery operation is performed in a relatively short time Tr2 (for example, 0.5 seconds). Specifically, the recovery operation is performed at the recovery speed (first speed) higher than the recovery speed (second speed) in the example shown in FIG. 4A. By this operation, as shown in FIG. 4B, the value of the recording gain can become stable at the final value more rapidly than in the normal case shown in FIG. 4A. By increasing the recovery speed and thus making the response quicker, it is possible to rapidly recognize the steady level (level of the input sound) after the recording level is changed.

FIG. 5 is a flowchart illustrating a setting process, of the recovery speed, on analog amplifier 13 in analog sound processor 115. The setting process, of the recovery speed, on analog amplifier 13 will be described with reference to the flowchart in FIG. 5.

A user can manipulate the recording level via operation unit 180. When the user performed the operation to decrease the recording level, information indicating that the operation was performed is transmitted from controller 130 to control circuit 19 in analog sound processor 115. If control circuit 19 receives from controller 130 the information indicating that the user performed the operation to decrease the recording level (step S31: YES), control circuit 19 sends to analog amplifier 13 a control signal for setting the recovery speed to the high speed (first speed) (step S32). Upon receiving this control signal, analog amplifier 13 sets the recovery speed to the high speed (first speed).

For example, analog amplifier 13 can change the setting of the recovery speed by changing a time constant of a circuit which sets the recovery speed. Specifically, the recovery speed can be switched by changing a circuit configuration such that at least one of resistor (R) and capacitor (C) of an RC circuit included in analog amplifier 13.

Note that, in analog amplifier 13, in the case that the recovery speed is set at the high speed (first speed), when the recovery is performed at the high speed and then the increasing of the recording gain G is stopped (step S15 in FIG. 3), the recovery speed is reset to a normal speed (second speed).

As described above, in the present exemplary embodiment, when the user has performed the operation to decrease the recording level, the recovery of the recording gain is performed at a speed higher than in the case of the normal recovery. This operation can rapidly return the recording gain to the original value; thus, it is possible to recognize the steady level immediately after the change of the recording level.

[1-3. Effects Etc.]

Analog sound processor 115 (an example of the sound signal processing apparatus) of the present exemplary embodiment includes: microphone amplifier 11 (an example of the first amplifier) which amplifies the sound signal A having been input, depending on the recording level; and analog amplifier 13 (the second amplifier) which amplifies the sound signal A' from microphone amplifier 11 with the recording gain G. Analog amplifier 13 decreases, when the level of the sound output D is greater than the upper limit threshold, the recording gain G of analog amplifier 13 and increases, when the level of the sound output D is smaller than the upper limit threshold and the value of the recording gain G is lower than the initial value Gint, the recording gain G at the first speed. In the case that the recording gain G is increased, when a user has performed an operation to decrease the recording level (an example of the input level) immediately before the increase of the recording gain G, control circuit 19 changes the recording gain G of analog amplifier 13 at the first speed. On the other hand, when the user has not performed the operation to decrease the recording level, control circuit 19 changes the recording gain G of analog amplifier 13 at the second speed lower than the first speed.

By controlling the recovery speed of the recording gain G as described above, when the user has performed the operation to decrease the recording level, the recording gain G can be rapidly changed; thus, the steady level can be recognized immediately after the recording level is changed.

Other Exemplary Embodiments

The first exemplary embodiment has been described above as an example of the technique disclosed in the present application. However, the technique in the present disclosure is not limited to the above exemplary embodiment and can also be applied to an exemplary embodiment in which modification, replacement, addition, omission, or the like is performed appropriately. In addition, a new exemplary embodiment can be made by combining the components described in the above first exemplary embodiment with other components.

In the above exemplary embodiment, the recording gain of analog amplifier 13 is changed in analog sound processor 115, depending on the level of the sound signal being input. At that time, the level of the sound signal being input is determined based on the output D of A/D converter 15. However, the level of the sound signal being input may be determined based on other signals. For example, the signal level of the sound signal being input may be determined based on the input to A/D converter 15 or may be determined based on the input signal to analog amplifier 13. That is, any signal can be used if the level of the signal changes depending on the sound signal being input.

In the above exemplary embodiment, in step S11, the above-described process may be performed not depending on whether the level of the sound output D is greater than the upper limit threshold or is not greater than the upper limit threshold, but depending on whether the level of the sound output D is not smaller than the upper limit threshold or is smaller than the upper limit threshold. Further, in step S12, the above-mentioned process may be performed not depending on whether the value of the recording gain G is lower than the initial value Gint or not lower than the initial value Gint, but depending on whether the value of the recording gain G is not greater than the initial value Gint or greater than the initial value Gint. Further, in step S14, the above-described process may be performed not depending on whether the sound output D has exceeded the upper limit threshold or is not greater than the upper limit threshold, but depending on whether the sound output D is not smaller than the upper limit threshold or is smaller than the upper limit threshold.

In the above exemplary embodiment, an example has been described in which the sound signal processing apparatus (analog sound processor) of the present disclosure is applied to a digital camera; however, the configuration of the sound signal processing apparatus of the present disclosure can be applied to various electronic devices if the electronic devices receive a sound signal and perform a predetermined process such as recording (recording, outputting, editing, and the like of a sound) on the sound signal having been input. For example, the configuration of the sound signal processing apparatus of the present disclosure can be applied to a video camera, a smartphone, a portable telephone, an integrated-circuit (IC) recorder, a speaker, and the like.

As described above, the exemplary embodiment has been described as an example of a technique according to the present disclosure. The accompanying drawings and detailed description have been provided for this purpose.

Therefore, the components described in the accompanying drawings and in the detailed description include not only components necessary for solving the problems but also components which are for exemplifying the above technique but are not necessary for solving the problems. For this reason, it should not be immediately recognized that those unnecessary components are necessary just because those unnecessary components are described in the accompanying drawings and the detailed description.

In addition, because the above exemplary embodiments are for exemplifying the technique in the present disclosure, various modifications, replacements, additions, removals, or the like can be made without departing from the scope of the accompanying claims or the equivalent thereof.

The sound signal processing apparatus of the present disclosure can be applied to an automatic level control device in which an output level of a sound signal having been input can be automatically adjusted.

What is claimed is:

1. A sound signal processing apparatus comprising:
a first amplifier which amplifies a sound signal having been input, depending on a set level of the sound signal; and
a second amplifier which amplifies the sound signal amplified by the first amplifier with a gain,
wherein when a level of the sound signal amplified by the first amplifier is greater than an upper limit threshold, the second amplifier automatically decreases the gain, and
when the level of the sound signal amplified by the first amplifier is smaller than the upper limit threshold and the gain is lower than a predetermined value, the second amplifier automatically increases the gain, and
wherein when the second amplifier increases the gain,
the second amplifier changes the gain at a first speed when a user has performed an operation to decrease the set level, and
the second amplifier changes the gain at a second speed lower than the first speed when the user has not performed the operation to decrease the set level.

2. The sound signal processing apparatus according to claim 1, further comprising an analog-to-digital (A/D) converter which converts an analog signal having being output from the second amplifier to a digital signal, wherein when the level of the sound signal is greater than the upper limit threshold, the second amplifier decreases the gain such that a level of the analog signal being input to the A/D converter does not exceed a predetermined value.

3. The sound signal processing apparatus according to claim 2, wherein the second amplifier determines the level of the sound signal, based on an input signal or an output signal of the A/D converter.

4. An imaging device which images a subject to generate image data, the imaging device comprising:

a microphone which receives a sound to generate the sound signal; and the sound signal processing apparatus according to claim 1, which processes the sound signal generated by the microphone.

5. An imaging device which images a subject to generate image data, the imaging device comprising:

a microphone which receives a sound to generate the sound signal; and the sound signal processing apparatus according to claim 2, which processes the sound signal generated by the microphone.

6. An imaging device which images a subject to generate image data, the imaging device comprising:

a microphone which receives a sound to generate the sound signal; and the sound signal processing apparatus according to claim 3, which processes the sound signal generated by the microphone.

* * * * *